(12) United States Patent
Chang

(10) Patent No.: US 8,450,616 B2
(45) Date of Patent: May 28, 2013

(54) CIRCUIT BOARD AND MANUFACTURING METHOD THEREOF

(75) Inventor: Chen-Chuan Chang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 324 days.

(21) Appl. No.: 12/752,376

(22) Filed: Apr. 1, 2010

(65) Prior Publication Data

US 2010/0252303 A1 Oct. 7, 2010

(30) Foreign Application Priority Data

Apr. 2, 2009 (TW) .............................. 98111066 A

(51) Int. Cl.
*H05K 1/03* (2006.01)
*H05K 1/16* (2006.01)

(52) U.S. Cl.
USPC ........... 174/255; 174/251; 174/260; 361/753; 361/760; 361/761; 361/807; 361/809

(58) Field of Classification Search
None
See application file for complete search history.

(56) References Cited

U.S. PATENT DOCUMENTS 4,714,516 A * 12/1987 Eichelberger et al. .......... 216/62
6,787,398 B2 * 9/2004 Tateoka et al. ................ 438/125

FOREIGN PATENT DOCUMENTS

| JP | 7336055 | 12/1995 |
|---|---|---|
| JP | 11-154789 | 6/1999 |
| JP | 2001-358247 | 12/2001 |
| JP | 2006019441 | 1/2006 |
| JP | 2006-128207 | 5/2006 |
| JP | 2007266196 | 10/2007 |
| TW | 200636943 | 10/2006 |

OTHER PUBLICATIONS

"Office Action of Japan Counterpart Application", issued on Apr. 20, 2012, p. 1-p. 2.
Japanese Examination Report of Japanese Application No. 2010-081079, dated Dec. 27, 2011.

* cited by examiner

*Primary Examiner* — Jayprakash N Gandhi
*Assistant Examiner* — Dion Ferguson
(74) *Attorney, Agent, or Firm* — J.C. Patents

(57) ABSTRACT

A circuit board having a removing area is provided. The circuit board includes a first dielectric layer, a first laser resistant structure disposed on the first dielectric layer and located at the periphery of the removing area, a second dielectric layer disposed on the first dielectric layer, a circuit layer disposed on the second dielectric layer, a second laser resistant structure disposed on the second dielectric layer and located at the periphery of the removing area, and a third dielectric layer disposed on the second dielectric layer. The second laser resistant structure is insulated from the circuit layer. There is a gap between the second laser resistant structure and the circuit layer, and the vertical projection of the gap on a first surface overlaps the first laser resistant structure. The third dielectric layer exposes the portion of the circuit layer within the removing area.

8 Claims, 14 Drawing Sheets

US 8,450,616 B2

CIRCUIT BOARD AND MANUFACTURING METHOD THEREOF

CROSS-REFERENCE TO RELATED APPLICATION

This application claims the priority benefit of Taiwan application serial no. 98111066, filed on Apr. 2, 2009. The entirety of the above-mentioned patent application is hereby incorporated by reference herein and made a part of this specification.

BACKGROUND OF THE INVENTION

1. Field of the Invention

The present invention generally relates to a circuit board and a manufacturing method thereof, and more particularly, to a circuit board and a manufacturing method thereof with effective laser machining depth control.

2. Description of Related Art

Today's market demands electronic products to be designed small, slim, light, and highly portable. Accordingly, electronic parts in these electronic products have to be designed small and thin too. Thereby, a conventional technique for reducing the thickness of a portion of a circuit board is provided.

FIGS. 1A-1C are cross-sectional views illustrating a conventional circuit board manufacturing process, and FIG. 2 is a top view of a circuit substrate in FIGS. 1A-1C, wherein FIGS. 1A-1C are cross-sectional views illustrating the conventional circuit board manufacturing process along line I-I' in FIG. 2.

First, referring to both FIG. 1A and FIG. 2, a circuit substrate 100 having a first dielectric layer 110, a second dielectric layer 120, a circuit layer 130, a third dielectric layer 140, and a fourth dielectric layer 150 is provided. The second dielectric layer 120, the third dielectric layer 140, and the fourth dielectric layer 150 are sequentially stacked on the first dielectric layer 110, and the circuit layer 130 is disposed on the second dielectric layer 120 and located between the second dielectric layer 120 and the third dielectric layer 140. The circuit substrate 100 has a pre-removing area L.

Then, referring to FIG. 1B, the portions of the third dielectric layer 140 and the fourth dielectric layer 150 located at the periphery of the pre-removing area L are removed through laser machining. Next, referring to FIG. 1C, the portions of the third dielectric layer 140 and the fourth dielectric layer 150 located within the pre-removing area L are removed to form a removing area L1. Herein a circuit board P is roughly formed. Because the removing area L1 of the circuit board P is thinner than other areas of the circuit board P, an electronic device 200 may be disposed within the removing area L1 in an actual application to reduce the total thickness of the circuit board P and the electronic device 200 disposed thereon.

However, it is difficult to control the depth of the laser machining when the third dielectric layer 140 and the fourth dielectric layer 150 are removed through laser machining. As a result, the second dielectric layer 120 or even the first dielectric layer 110 may be over trenched.

SUMMARY OF THE INVENTION

Accordingly, the present invention is directed to a circuit board, and more particularly, to a circuit board structure with effective laser machining depth control.

The present invention is further directed to a manufacturing method of a circuit board, wherein the laser machining depth is effectively controlled.

The present invention provides a circuit board having a removing area. The circuit board includes a first dielectric layer, a first laser resistant structure, a second dielectric layer, a circuit layer, a second laser resistant structure, and a third dielectric layer. The first laser resistant structure is disposed on a first surface of the first dielectric layer and located at the periphery of the removing area. The second dielectric layer is disposed on the first dielectric layer and covers the first laser resistant structure. The circuit layer is disposed on a second surface of the second dielectric layer, and a portion of the circuit layer is extended from outside of the removing area into the removing area. The second laser resistant structure is disposed on the second surface and located at the periphery of the removing area, and the second laser resistant structure is insulated from the circuit layer. There is at least one gap between the second laser resistant structure and the circuit layer, and the vertical projection of the gap on the first surface overlaps the first laser resistant structure. The third dielectric layer is disposed on the second dielectric layer and has an opening corresponding to the removing area, wherein the opening exposes the portions of the circuit layer located within the removing area. The third dielectric layer covers a portion of the second laser resistant structure.

According to an embodiment of the present invention, the second laser resistant structure is an annular structure, wherein the annular structure has at least one nick, and the circuit layer is extended from the nick into the removing area.

According to an embodiment of the present invention, the first laser resistant structure includes a plurality of punctual structures independent from each other when there are multiple gaps between the second laser resistant structure and the circuit layer.

According to an embodiment of the present invention, the first laser resistant structure includes a strip structure.

According to an embodiment of the present invention, the strip structure overlaps the vertical projection of the second laser resistant structure on the first surface.

According to an embodiment of the present invention, the second dielectric layer has at least one cavity located below the gap.

According to an embodiment of the present invention, the cavity exposes the first laser resistant structure.

According to an embodiment of the present invention, the circuit board further includes a third laser resistant structure, wherein the third laser resistant structure is disposed on the second surface and located at the periphery of the pre-removing area, and the third laser resistant structure is connected with the portion of the circuit layer located at the periphery of the removing area and is insulated from the second laser resistant structure.

According to an embodiment of the present invention, the circuit board further includes a protection layer, wherein the protection layer covers the portion of the circuit layer located within the removing area.

According to an embodiment of the present invention, the opening exposes a portion of the second laser resistant structure located within the removing area.

The present invention provides a manufacturing method of a circuit board. First, a substrate having a pre-removing area is provided. The substrate includes a first dielectric layer, a first laser resistant structure, a second dielectric layer, a circuit layer, a second laser resistant structure, and a third dielectric layer. The first laser resistant structure is disposed on a first surface of the first dielectric layer and located at the periphery of the pre-removing area. The second dielectric layer is disposed on the first dielectric layer and covers the first laser resistant structure. The circuit layer is disposed on a second surface of the second dielectric layer, and a portion of the circuit layer is extended from outside of the pre-removing area into the pre-removing area. The second laser resistant structure is disposed on the second surface and located at the periphery of the pre-removing area, and the second laser resistant structure is insulated from the circuit layer. There is at least one gap between the second laser resistant structure and the circuit layer, and the vertical projection of the gap on the first surface overlaps the first laser resistant structure. The third dielectric layer is disposed on the second dielectric layer and covers the circuit layer and the second laser resistant structure. Then, a laser machining process is performed to etch the third dielectric layer located at the periphery of the pre-removing area. Next, the portion of the third dielectric layer located within the pre-removing area is removed.

According to an embodiment of the present invention, the laser machining process further includes etching the portion of the second dielectric layer located below the gap.

According to an embodiment of the present invention, the laser machining process does not etch the first dielectric layer.

According to an embodiment of the present invention, the technique of removing the third dielectric layer includes a lift-off technique.

According to an embodiment of the present invention, the second laser resistant structure is an annular structure, wherein annular structure has at least one nick, and the circuit layer is extended from the nick into the pre-removing area.

According to an embodiment of the present invention, the first laser resistant structure includes a plurality of punctual structures independent from each other when there are multiple gaps between the second laser resistant structure and the circuit layer.

According to an embodiment of the present invention, the first laser resistant structure includes a strip structure.

According to an embodiment of the present invention, the strip structure overlaps the vertical projection of the second laser resistant structure on the first surface.

According to an embodiment of the present invention, the substrate further includes a third laser resistant structure, the third laser resistant structure is disposed on the second surface and located at the periphery of the pre-removing area, and the third laser resistant structure is connected with the portion of the circuit layer located at the periphery of the removing area and is insulated from the second laser resistant structure.

According to an embodiment of the present invention, the substrate further includes a protection layer, wherein the protection layer covers the portion of the circuit layer located within the pre-removing area.

According to an embodiment of the present invention, the manufacturing method further comprises performing an etching process to remove the second laser resistant structure.

According to an embodiment of the present invention, the manufacturing method further comprises performing a mechanical processing to remove a portion of the second laser resistant structure located within the pre-removing area.

According to an embodiment of the present invention, the manufacturing method further comprises performing an etching process to remove the first laser resistant structure.

According to an embodiment of the present invention, the manufacturing method further comprises performing a mechanical processing to remove the first laser resistant structure.

The present invention provides a circuit board having a removing area. The circuit board comprises a first dielectric layer, a circuit layer, a laser resistant structure, and a second dielectric layer. The circuit layer is disposed on a surface of the first dielectric layer, wherein a portion of the circuit layer is extended from outside of the removing area into the removing area. The laser resistant structure is disposed on the surface, located at the periphery of the removing area, and insulated from the circuit layer, wherein there is at least one gap between the laser resistant structure and the circuit layer. The second dielectric layer is disposed on the first dielectric layer, and has an opening corresponding to the removing area, wherein the opening exposes a portion of the circuit layer located within the removing area.

As described above, in the present invention, the circuit board has a first laser resistant structure and a second laser resistant structure such that the depth of laser machining can be controlled through the second laser resistant structure, and the first dielectric layer under the first laser resistant structure is protected by the first laser resistant structure from the laser machining process.

In order to make the above and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
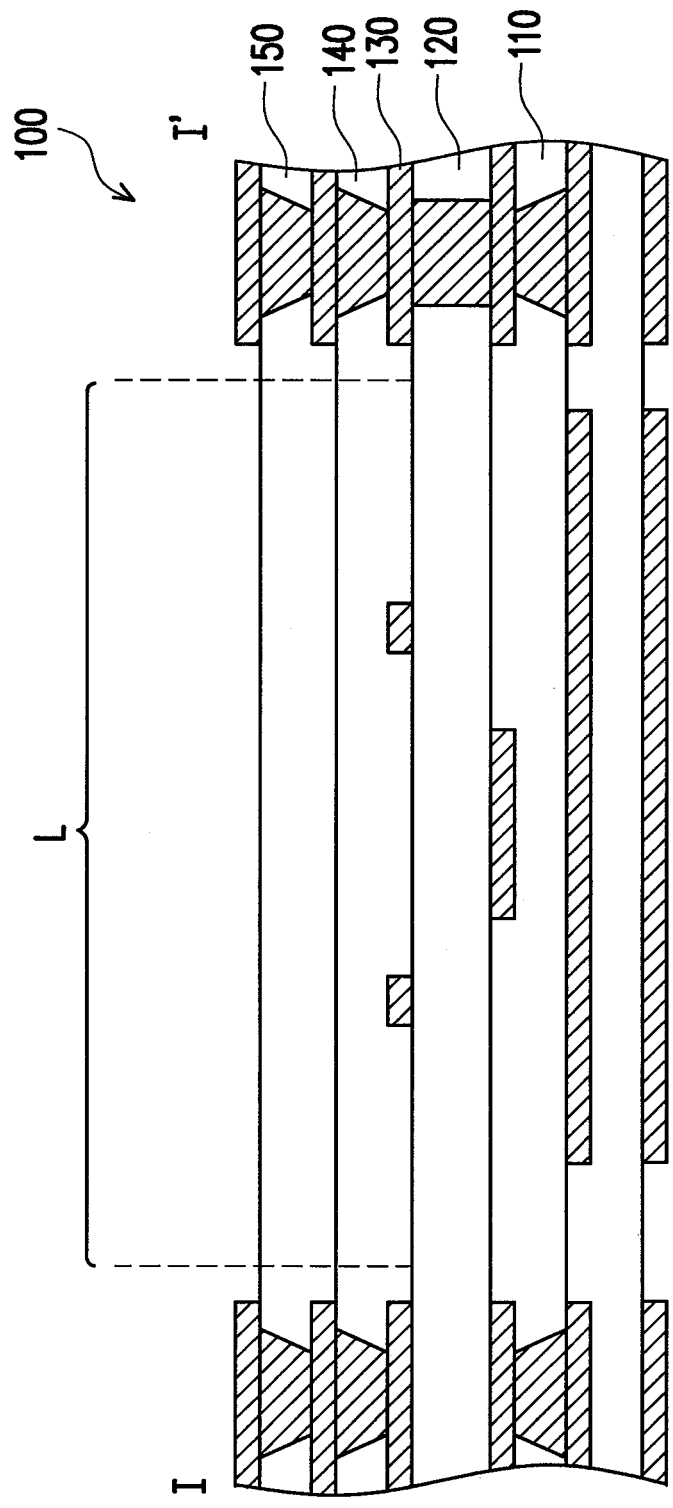
FIGS. 1A-1C are cross-sectional views illustrating a conventional circuit board manufacturing process.
Figure 1B:
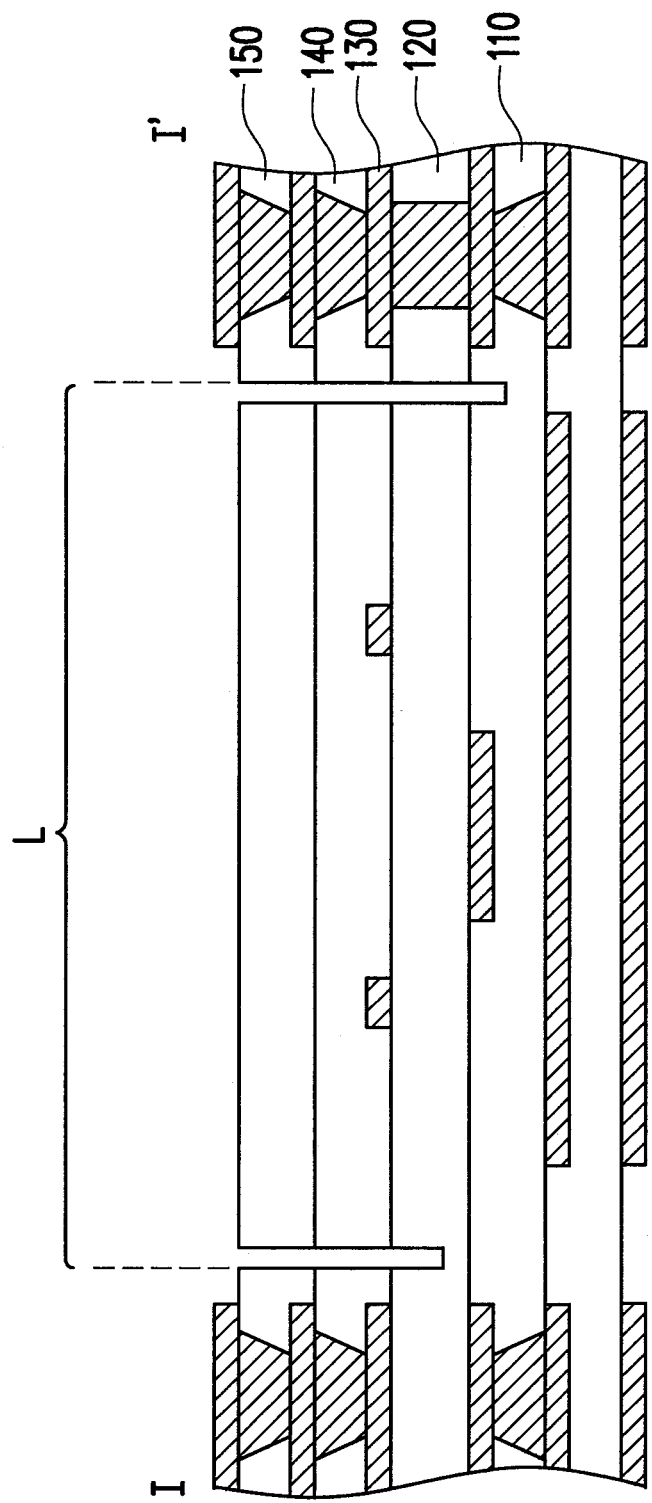
Figure 1C:
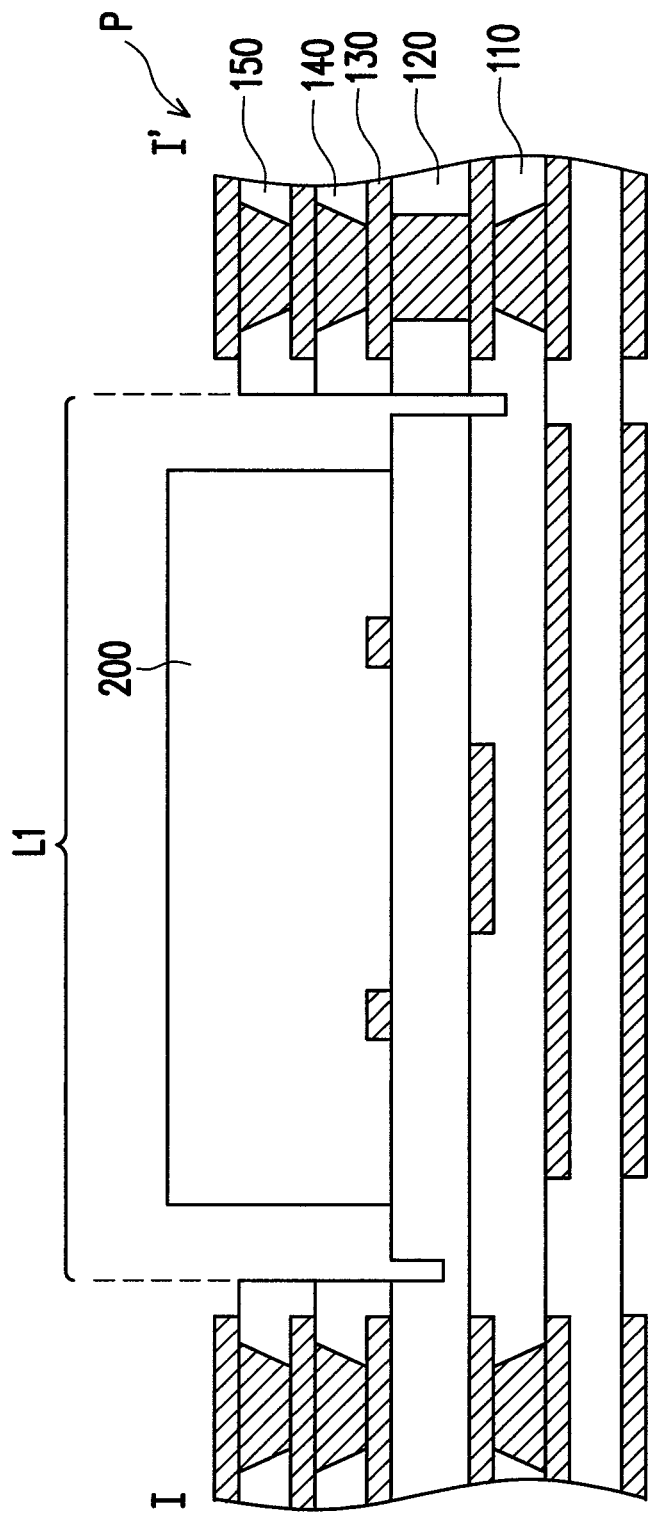
Figure 2:
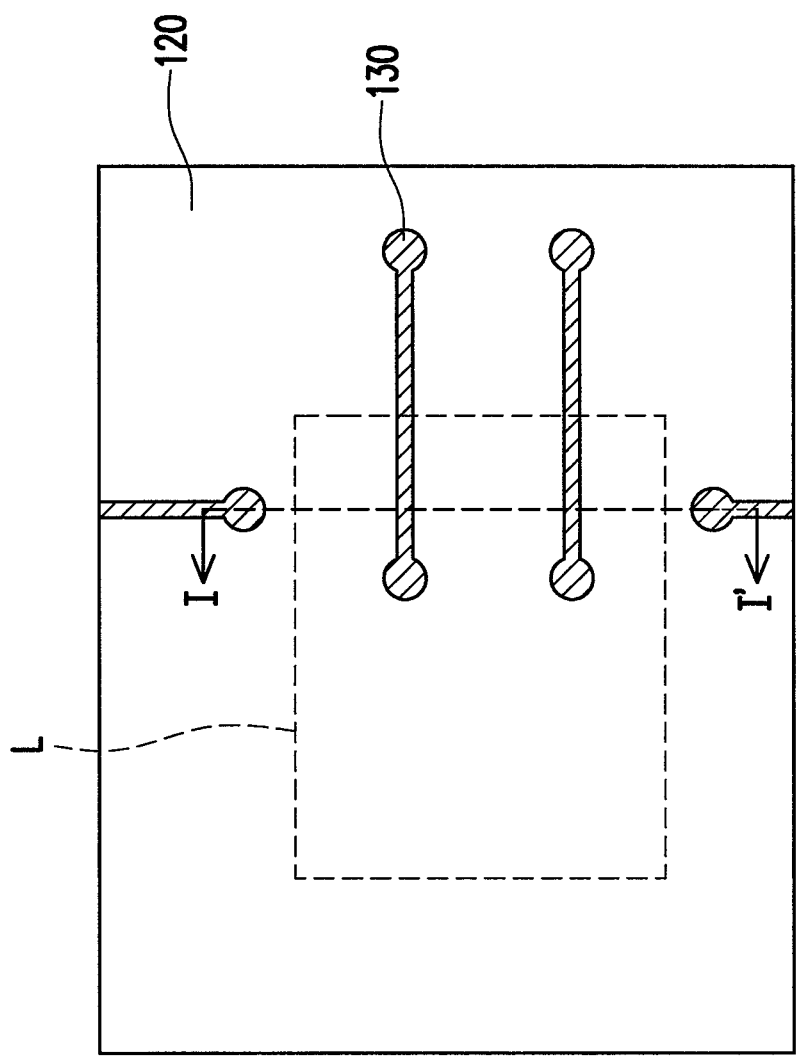
FIG. 2 is a top view of a circuit substrate in FIGS. 1A-1C.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
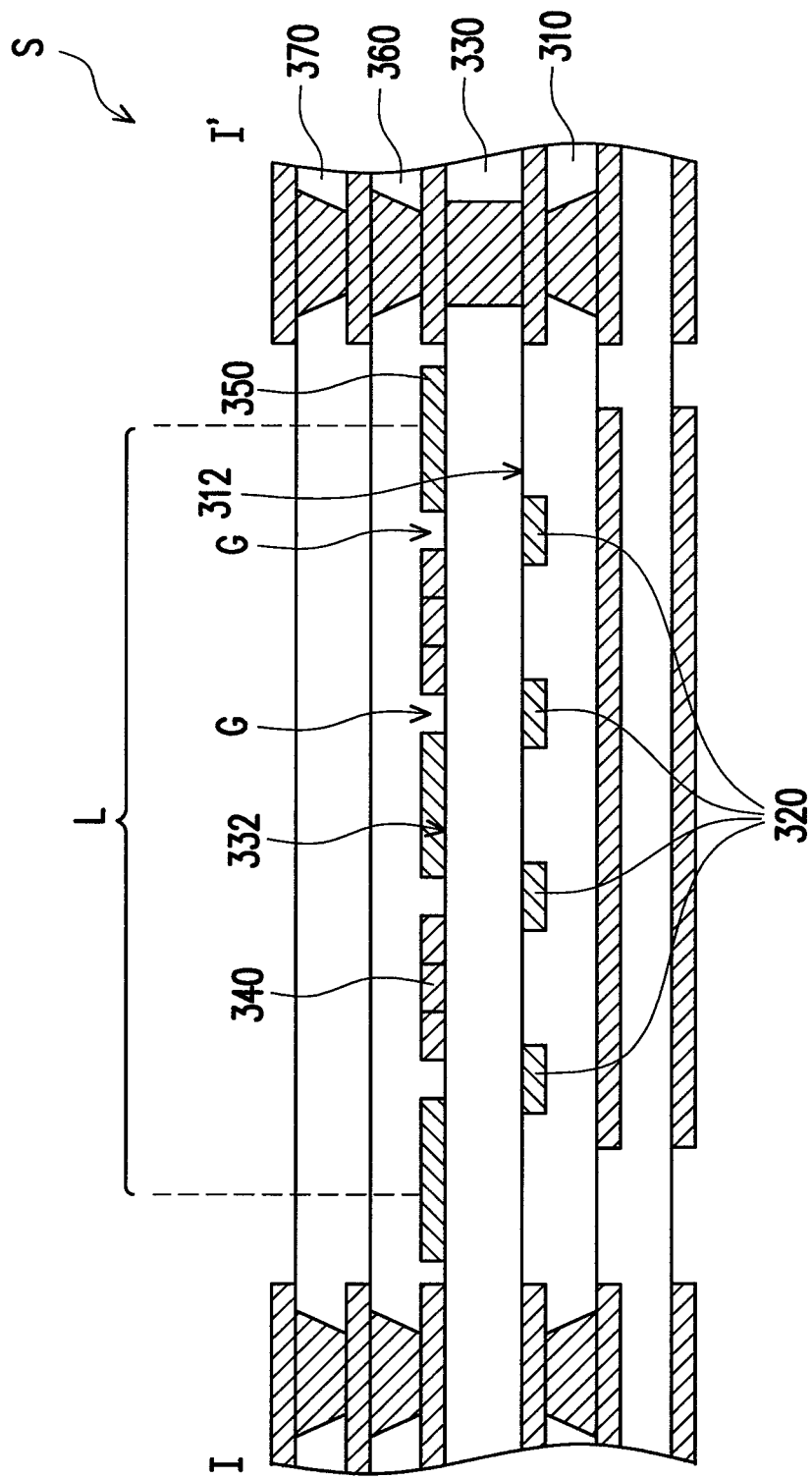
FIGS. 3A-3D' and FIGS. 4A-4C are cross-sectional views illustrating a circuit board manufacturing process according to an embodiment of the present invention.
Figure 3B:
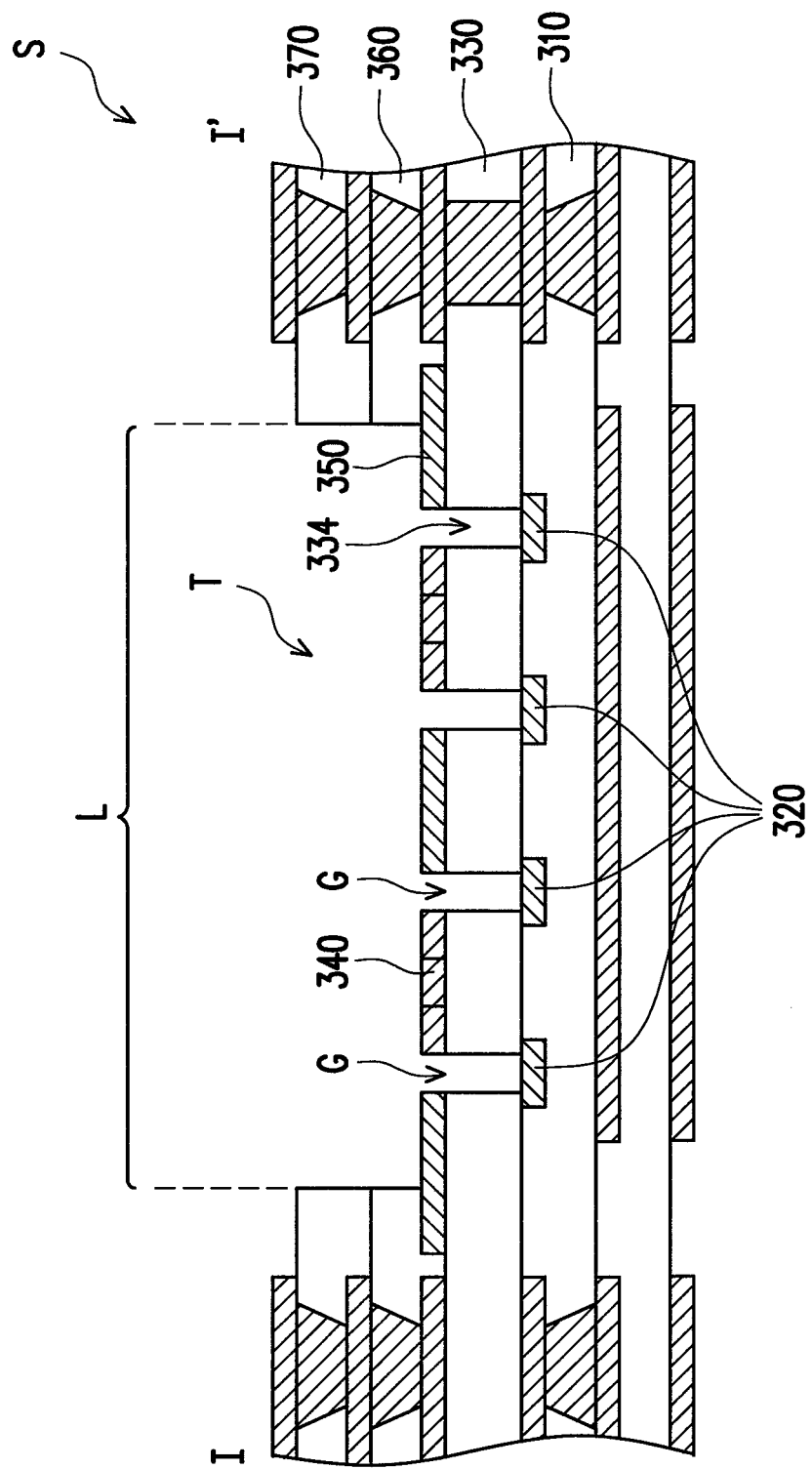
Figure 3C:
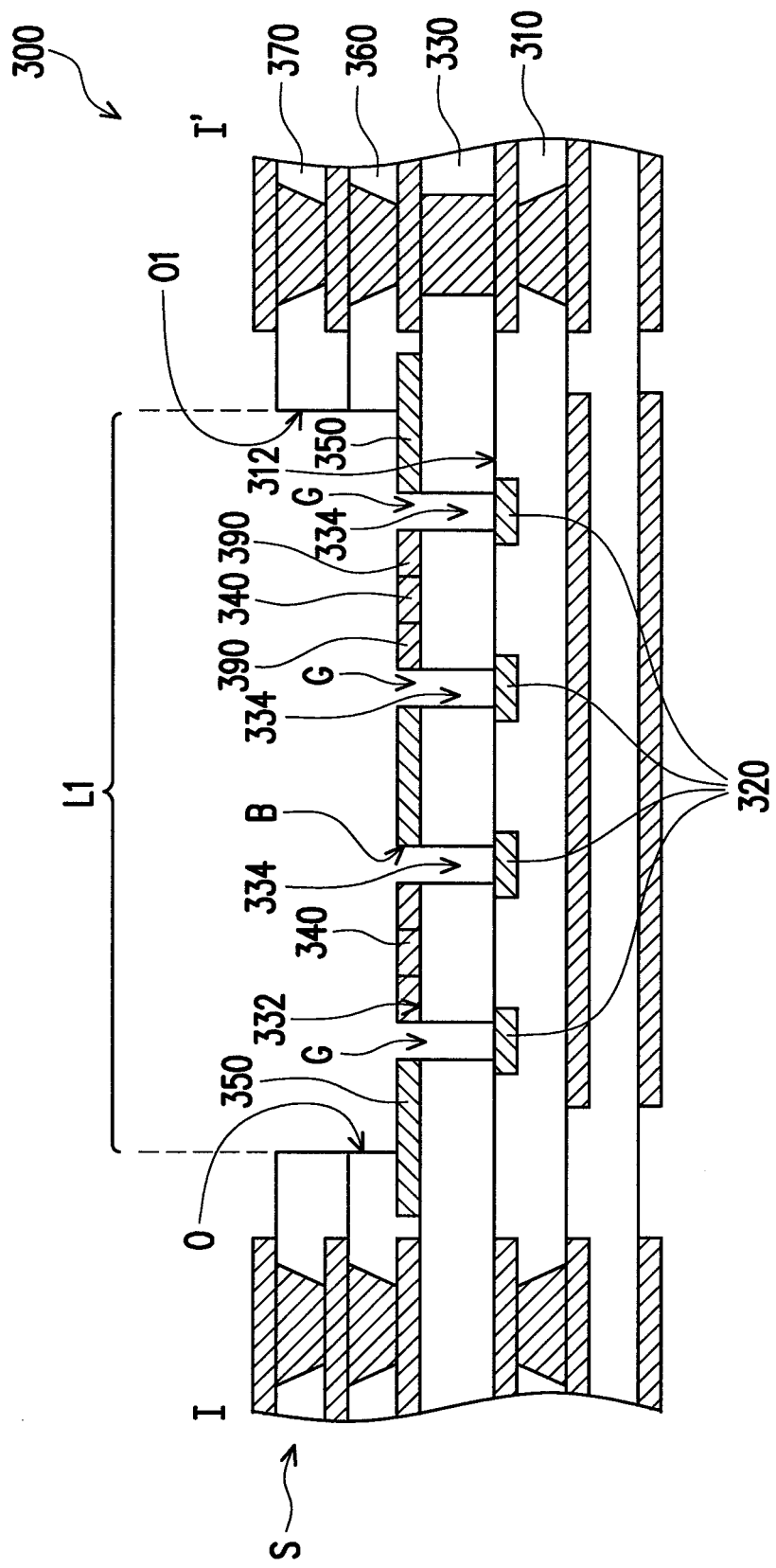
Figure 3D:
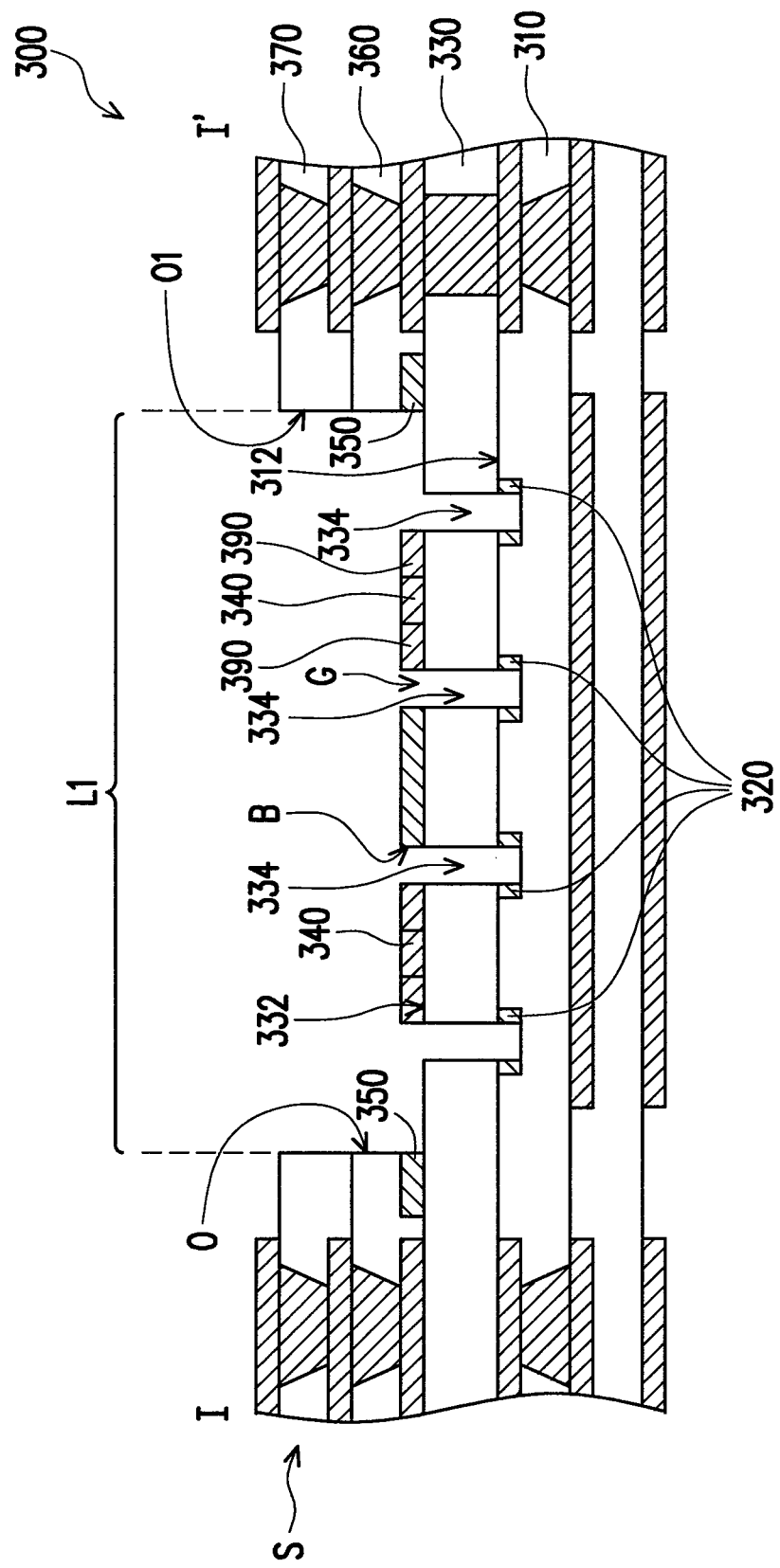
Figure 3D:
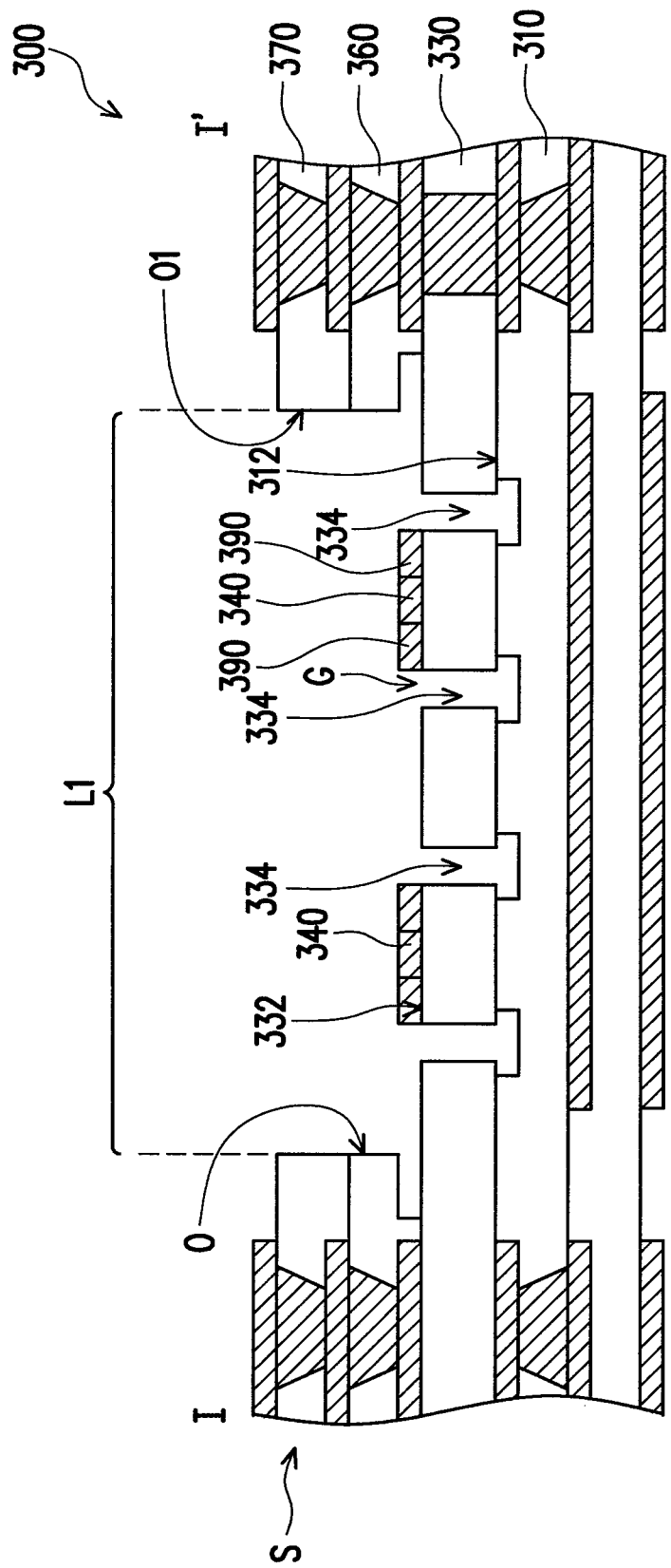
Figure 4A:
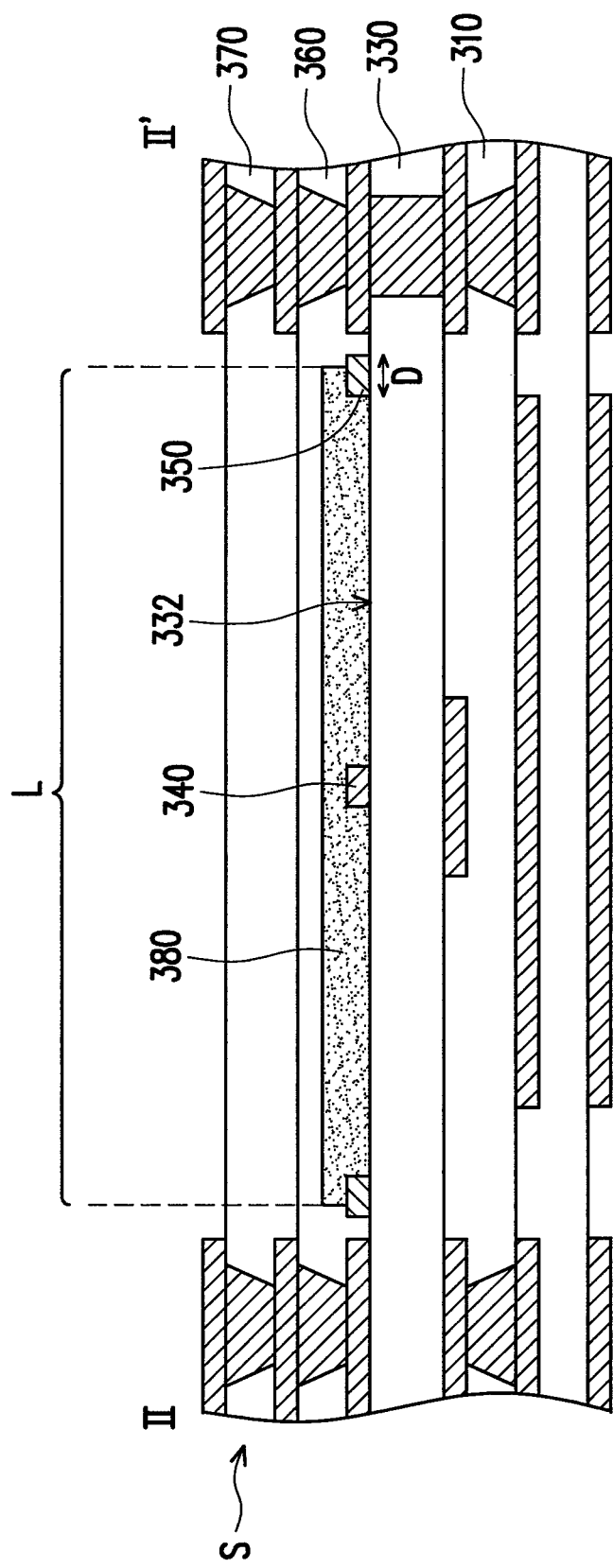
Figure 4B:
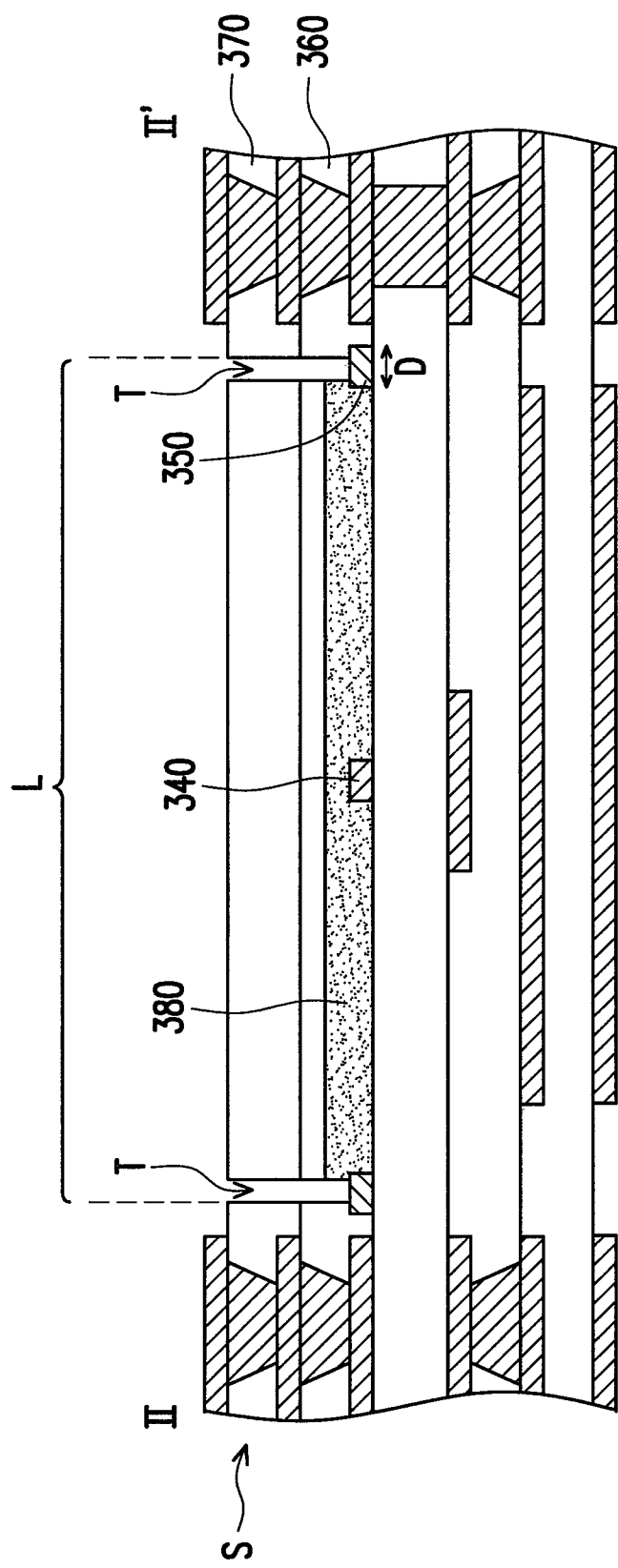
Figure 4C:
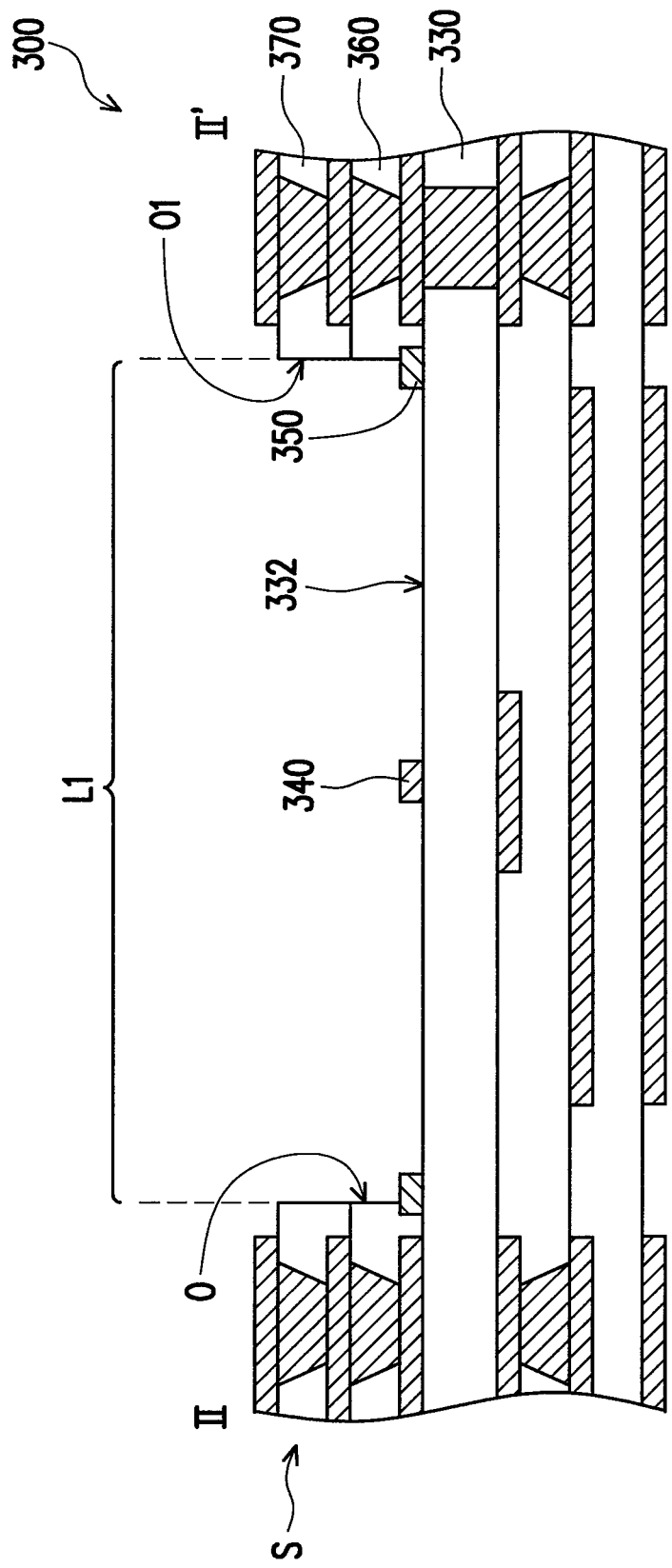
Figure 5:
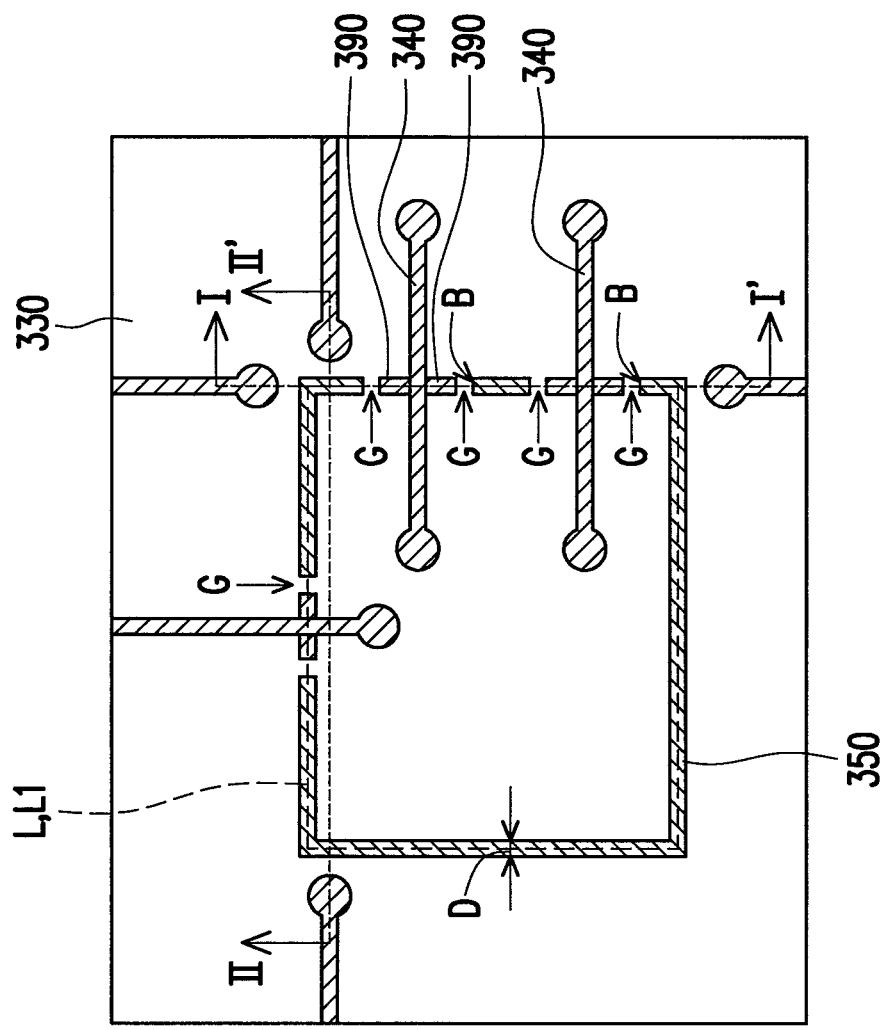
FIG. 5 is a top view of a circuit layer and a second laser resistant structure of a substrate in FIGS. 3A-3C and FIGS. 4A-4C.
Figure 6:
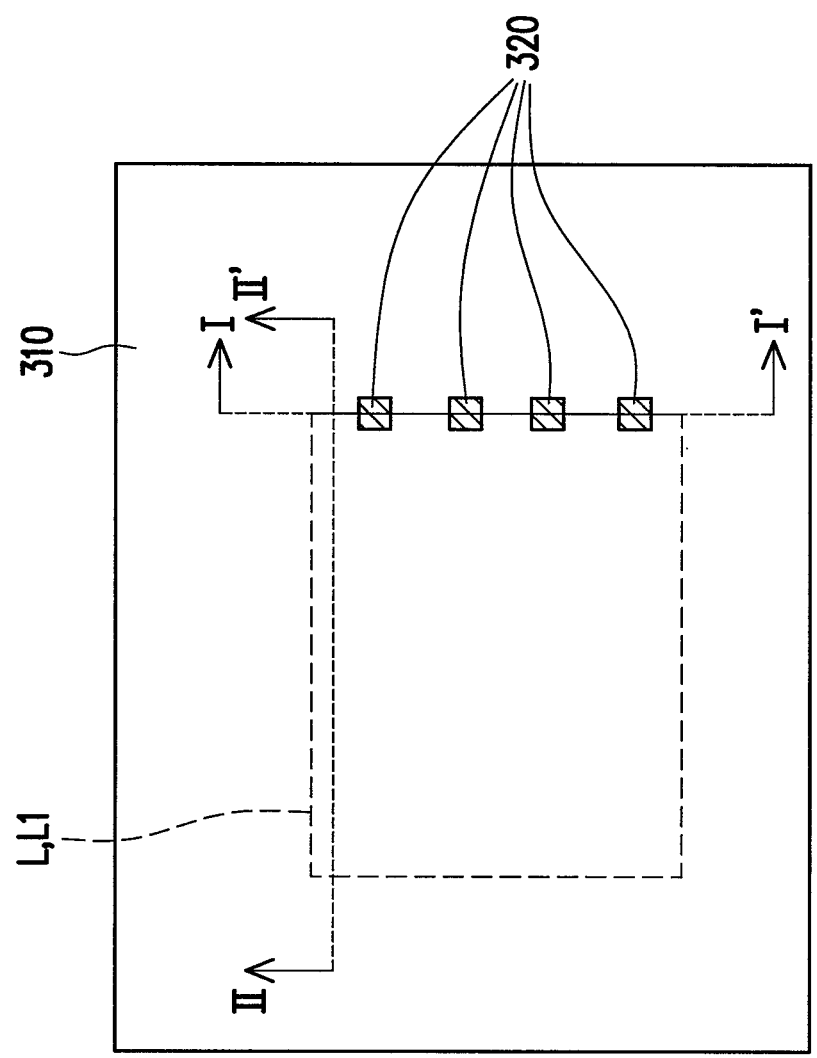
FIG. 6 is a top view of a first laser resistant structure of a substrate in FIGS. 3A-3C and FIGS. 4A-4C.

FIGS. 3A-3D' and FIGS. 4A-4C are cross-sectional views illustrating a circuit board manufacturing process according to an embodiment of the present invention. FIG. 5 is a top view of a circuit layer and a second laser resistant structure of a substrate in FIGS. 3A-3C and FIGS. 4A-4C. FIG. 6 is a top view of a first laser resistant structure of the substrate in FIGS. 3A-3C and FIGS. 4A-4C.

It should be noted that the position of the line I-I' in FIG. 5 is corresponding to the position of the line I-I' in FIG. 6, and FIGS. 3A-3C are cross-sectional views illustrating a circuit board manufacturing process along the lines I-I' in FIG. 5 and FIG. 6 according to an embodiment of the present invention. The position of the line II-II' in FIG. 5 is corresponding to the position of the line II-II' in FIG. 6, and FIGS. 4A-4C are cross-sectional views illustrating a circuit board manufacturing process along the lines II-II' in FIG. 5 and FIG. 6 according to an embodiment of the present invention.

First, referring to FIGS. 3A, 4A, 5, and 6, a substrate S having a pre-removing area L is provided. The substrate S includes a first dielectric layer 310, a first laser resistant structure 320, a second dielectric layer 330, a circuit layer 340, a second laser resistant structure 350, and a third dielectric layer 360.

The first laser resistant structure 320 is disposed on a first surface 312 of the first dielectric layer 310 and located at the periphery of the pre-removing area L. The second dielectric layer 330 is disposed on the first dielectric layer 310 and covers the first laser resistant structure 320. The circuit layer 340 is disposed on a second surface 332 of the second dielectric layer 330, and a portion of the circuit layer 340 is extended from outside of the pre-removing area L into the pre-removing area L.

The second laser resistant structure 350 is disposed on the second surface 332 and located at the periphery of the pre-removing area L and is insulated from the circuit layer 340. A portion of the second laser resistant structure 350 is located in the pre-removing area L and another portion of the second laser resistant structure 350 is located outside of the pre-removing area L. There is a plurality of gaps G between the second laser resistant structure 350 and the circuit layer 340, and the vertical projection of the gaps G on the first surface 312 overlaps the first laser resistant structure 320.

The third dielectric layer 360 is disposed on the second dielectric layer 330 and covers the circuit layer 340 and the second laser resistant structure 350. In the present embodiment, the substrate S further includes a fourth dielectric layer 370 disposed on the third dielectric layer 360.

In the present embodiment, the substrate S further includes a protection layer 380. The protection layer 380 covers the portion of the circuit layer 340 located within the pre-removing area L so that the circuit layer 340 will not be affected by the subsequent removal of the third dielectric layer 360 and the fourth dielectric layer 370.

Next, referring to FIGS. 3B, 4B, 5, and 6, a laser machining process is performed to etch the third dielectric layer 360 and the fourth dielectric layer 370 located at the periphery of the pre-removing area L. Through the laser machining process, a plurality of cavities T is formed on the third dielectric layer 360 and the fourth dielectric layer 370, and these cavities T expose the second laser resistant structure 350 and the circuit layer 340 located at the periphery of the pre-removing area L.

To be specific, the laser machining takes place at the periphery of the pre-removing area L (i.e., the area L marked with dotted lines in FIG. 5 and FIG. 6). Thus, a laser beam passing through the third dielectric layer 360 and the fourth dielectric layer 370 is blocked by the second laser resistant structure 350. Accordingly, in the present embodiment, the depth of the laser machining can be controlled through the second laser resistant structure 350, and accordingly the production yield can be improved.

In addition, to improve the performance of the second laser resistant structure 350 in laser machining blocking, in the present embodiment, the width D of the second laser resistant structure 350 is designed to be greater than the radian of the laser beam. Thus, ideally, the cavities T only expose the portion of the second laser resistant structure 350 located at the periphery of the pre-removing area L.

It should be noted that in the present embodiment, the substrate S has the first laser resistant structure 320, and when a laser beam passes through the second dielectric layer 330 below the gaps G, the laser beam is blocked by the first laser resistant structure 320 below the gaps G. Thus, the first laser resistant structure 320 can protect the first dielectric layer 310 below the first laser resistant structure 320 from the laser machining and help to control the depth of the laser machining. Herein the laser machining process may form cavities 334 on the second dielectric layer 330 below the gaps G.

Thereafter, referring to FIGS. 3C, 4C, 5, and 6, the portions of the third dielectric layer 360 and the fourth dielectric layer 370 located within the pre-removing area L are removed to form a removing area L1 wherein the third dielectric layer 360 covers a portion of the second laser resistant structure 350. The third dielectric layer 360 and the fourth dielectric layer 370 may be removed through a lift-off technique. In the present embodiment, the protection layer 380 is removed.

Referring to FIG. 3D, in the present embodiment, a portion of the second laser resistant structure 350 located within the removing area L1 is removed through a mechanical processing. In addition, a portion of the first laser resistant structure 320 is removed through a mechanical processing.

Referring to FIG. 3D', in the other embodiment, the second laser resistant structure 350 is removed through an etching processing. In addition, the first laser resistant structure 320 is removed through an etching processing.

Below, the structure of the circuit board 300 will be described in detail.

Referring to FIGS. 3C, 4C, 5, and 6, in the present embodiment, the circuit board 300 has a removing area L1, wherein the removing area L1 is a depressed area. The circuit board 300 includes a first dielectric layer 310, a first laser resistant structure 320, a second dielectric layer 330, a circuit layer 340, a second laser resistant structure 350, and a third dielectric layer 360.

The first laser resistant structure 320 is disposed on a first surface 312 of the first dielectric layer 310 and located at the periphery of the removing area L1. The second dielectric layer 330 is disposed on the first dielectric layer 310 and covers the first laser resistant structure 320. The circuit layer 340 is disposed on a second surface 332 of the second dielectric layer 330, and a portion of the circuit layer 340 is extended from outside of the removing area L1 into the removing area L1.

In the present embodiment, the circuit board 300 includes a plurality of third laser resistant structures 390. The third laser resistant structures 390 are disposed on the second surface 332 and located at the periphery of the removing area L1. The third laser resistant structures 390 are connected with the portion of the circuit layer 340 located at the periphery of the removing area L1 and are insulated from the second laser resistant structure 350.

The second laser resistant structure 350 is disposed on the second surface 332 and located at the periphery of the removing area L1, and the second laser resistant structure 350 is insulated from the circuit layer 340. There are a plurality of gaps G between the second laser resistant structure 350 and the circuit layer 340, and the vertical projection of the gaps G on the first surface 312 overlaps the first laser resistant structure 320.

In order to improve the performance of the first laser resistant structure 320 in the laser machining blocking, in the present embodiment, the size of the first laser resistant structure 320 is designed to be larger than the area of the vertical projection of the gaps G on the first surface 312 so that the vertical projection of the gaps G on the first surface 312 can completely fall on the first laser resistant structure 320. Additionally, in the present embodiment, the second dielectric layer 330 may have multiple cavities 334 located below the gaps G. The cavities 334 expose the first laser resistant structure 320.

To be specific, in the present embodiment, the second laser resistant structure 350 is an annular structure. The annular structure has a plurality of nicks B, and a portion of the circuit layer 340 is extended from the nicks B into the removing area L1. Besides, in the present embodiment, the first laser resistant structure 320 may be a plurality of punctual structures independent from each other. In other embodiments, the first laser resistant structure 320 may be a strip structure or an annular structure, and the strip structure or the annular structure may overlap the vertical projection of the second laser resistant structure 350 on the first surface 312.

The third dielectric layer 360 is disposed on the second dielectric layer 330 and has an opening O corresponding to the removing area L1. In the present embodiment, the circuit board 300 further includes a fourth dielectric layer 370. The fourth dielectric layer 370 is disposed on the third dielectric layer 360 and has an opening O1 corresponding to the opening O. The openings O and O1 expose the portions of the circuit layer 340 and the second laser resistant structure 350 located within the removing area L1. Moreover, in the present embodiment, a protection layer 380 may be disposed within the removing area L1, wherein the protection layer 380 covers the portion of the circuit layer 340 located within the removing area L1 to protect the circuit layer 340 exposed by the openings O and O1.

It should be noted that even though one removing area L1 is described as an example in the present embodiment, the present invention is not limited thereto. For example, in other embodiments, the circuit board may also have multiple removing areas, and these removing areas may be selectively located at the same side or two opposite sides of the circuit board.

As described above, a circuit board provided by the present invention has a first laser resistant structure and a second laser resistant structure such that the depth of the laser machining can be controlled through the second laser resistant structure. Besides, the first dielectric layer below the first laser resistant structure is protected by the first laser resistant structure from the laser machining.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, having a removing area, the circuit board comprising:
    a first dielectric layer;
    a first laser resistant structure for blocking a laser beam to prevent the laser beam from etching a dielectric layer below the first laser resistant structure, disposed on a first surface of the first dielectric layer and located at a periphery of the removing area;
    a second dielectric layer, disposed on the first dielectric layer and covering the first laser resistant structure;
    a circuit layer, disposed on a second surface of the second dielectric layer, wherein a portion of the circuit layer is extended from outside of the removing area into the removing area;
    a second laser resistant structure for blocking the laser beam to prevent the laser beam from etching a dielectric layer below the second laser resistant structure, disposed on the second surface, located at the periphery of the removing area, and insulated from the circuit layer, wherein the second laser resistant structure is an annular structure, there is at least one gap between the second laser resistant structure and the circuit layer, the circuit layer is extended from the gap into the removing area, and a vertical projection of the gap on the first surface overlaps the first laser resistant structure; and
    a third dielectric layer, disposed on the second dielectric layer, and having an opening corresponding to the removing area, wherein the opening exposes a portion of the circuit layer located within the removing area and the third dielectric layer covers a portion of the second laser resistant structure.

2. The circuit board according to claim 1, wherein the first laser resistant structure comprises a plurality of punctual structures independent from each other when there are multiple gaps between the second laser resistant structure and the circuit layer.

3. The circuit board according to claim 1, wherein the first laser resistant structure comprises a strip structure or an annular structure and the strip structure or the annular structure overlaps a vertical projection of the second laser resistant structure on the first surface.

4. The circuit board according to claim 1, wherein the second dielectric layer has at least one cavity located below the gap and the cavity exposes the first laser resistant structure.

5. The circuit board according to claim 1 further comprising a third laser resistant structure, the third laser resistant structure is disposed on the second surface and located at the periphery of the removing area, and the third laser resistant structure is connected with a portion of the circuit layer located at the periphery of the removing area and is insulated from the second laser resistant structure.

6. The circuit board according to claim 1 further comprising a protection layer, wherein the protection layer covers the portion of the circuit layer located within the removing area.

7. The circuit board according to claim 1, wherein the opening exposes a portion of the second laser resistant structure located within the removing area.

8. A circuit board, having a removing area, the circuit board comprising:
    a first dielectric layer;
    a circuit layer, disposed on a surface of the first dielectric layer, wherein a portion of the circuit layer is extended from outside of the removing area into the removing area;
    a laser resistant structure for blocking a laser beam to prevent the laser beam from etching a dielectric layer below the laser resistant structure, disposed on the surface, located at the periphery of the removing area, and insulated from the circuit layer, wherein the second laser resistant structure is an annular structure, there is at least one gap between the laser resistant structure and the circuit layer, and the circuit layer is extended from the gap into the removing area; and
    a second dielectric layer, disposed on the first dielectric layer, and having an opening corresponding to the removing area, wherein the opening exposes a portion of the circuit layer located within the removing area.

* * * * *